(12) United States Patent
Lin et al.

(10) Patent No.: US 7,233,268 B1
(45) Date of Patent: Jun. 19, 2007

(54) MULTI-STAGE SAMPLE RATE CONVERTER

(75) Inventors: Lekun Lin, San Jose, CA (US); Sheng Lin, Sunnyvale, CA (US)

(73) Assignee: RDW, Inc., Milpitas, CA (US)

( * ) Notice: Subject to any disclaimer, the term of this patent is extended or adjusted under 35 U.S.C. 154(b) by 0 days.

(21) Appl. No.: 11/422,071

(22) Filed: Jun. 3, 2006

(51) Int. Cl.
*H03M 7/00* (2006.01)

(52) U.S. Cl. ......................................... 341/61; 341/143

(58) Field of Classification Search ................... 341/61, 341/143; 370/913, 914
See application file for complete search history.

(56) References Cited

U.S. PATENT DOCUMENTS

| | | | |
|---|---|---|---|
| 5,727,074 A * | 3/1998 | Hildebrand | 381/103 |
| 5,987,145 A * | 11/1999 | Lawton | 381/103 |
| 6,208,671 B1 * | 3/2001 | Paulos et al. | 370/545 |
| 6,413,217 B1 * | 7/2002 | Mo | 600/440 |
| 6,531,970 B2 * | 3/2003 | McLaughlin et al. | 341/61 |
| 6,747,858 B1 * | 6/2004 | Sculley et al. | 361/61 |
| 7,057,627 B2 * | 6/2006 | MacInnis et al. | 345/636 |
| 7,183,949 B2 * | 2/2007 | Park | 341/61 |
| 2005/0117069 A1 * | 6/2005 | McNeely | 348/725 |

* cited by examiner

*Primary Examiner*—Peguy JeanPierre
(74) *Attorney, Agent, or Firm*—Joe Zheng

(57) ABSTRACT

Architectures of multi-stage sample rate converters are disclosed. According to one aspect of the present invention, a received signal with a higher sampling rate is converted to a lower sampling rate. To prevent aliasing in the resultant signal, an anti-aliasing filter is introduced. The passband of the anti-aliasing filter is so adjusted according to the conversation rate of a sample rate converter. To keep the implementation relatively simple, the coefficients of the filter are kept constant. Therefore, the conversation rate of a sample rate converter is constrained in a limited range, thus requiring only a constant anti-aliasing filter. A series of halfband filters are then used to convert the signal to a desired sampling rate.

15 Claims, 5 Drawing Sheets

Table 1

$$C_{-2} = -\frac{1}{120}\mu^5 \quad +\frac{1}{24}\mu^4 \quad -\frac{1}{24}\mu^3 \quad -\frac{1}{24}\mu^2 \quad +\frac{1}{20}\mu$$

$$C_{-1} = \frac{1}{24}\mu^5 \quad -\frac{1}{6}\mu^4 \quad -\frac{1}{24}\mu^3 \quad +\frac{2}{3}\mu^2 \quad -\frac{1}{2}\mu$$

$$C_0 = -\frac{1}{12}\mu^5 \quad +\frac{1}{4}\mu^4 \quad +\frac{5}{12}\mu^3 \quad -\frac{5}{4}\mu^2 \quad -\frac{1}{3}\mu \quad +1$$

$$C_1 = \frac{1}{12}\mu^5 \quad -\frac{1}{6}\mu^4 \quad -\frac{7}{12}\mu^3 \quad +\frac{2}{3}\mu^2 \quad +1\mu$$

$$C_2 = \frac{1}{24}\mu^5 \quad +\frac{1}{24}\mu^4 \quad +\frac{7}{24}\mu^3 \quad -\frac{1}{24}\mu^2 \quad -\frac{1}{4}\mu$$

$$C_3 = \frac{1}{120}\mu^5 \quad \quad -\frac{1}{24}\mu^3$$

FIG. 1C

MULTI-STAGE SAMPLE RATE CONVERTER

BACKGROUND OF THE INVENTION

1. Field of the Invention

The present invention is related to the area of digital signal processing. More particularly, the present invention is related to architectures of an integrated circuit for converting signal sample rates, which can be advantageously used in various wireless communication systems including WiMAX.

2. Description of the Related Art

The IEEE Standards Authority approved the 802.16 (also referred to as WiMAX) specification for wireless metropolitan-area networks (MANs) in the 2- to 11-GHz range, giving a seal of approval to technology that some people said could enable a disruptive change in communications. This is because partly WiMAX supports different sampling rates. Thus, sample rate converters are needed in both transmitters and receivers.

In this disclosure, architectures of multi-stage sample rate converters are disclosed. Besides many other applications, such sample rate converters can be advantageously used in systems supporting WiMAX.

SUMMARY OF THE INVENTION

This section is for the purpose of summarizing some aspects of the present invention and to briefly introduce some preferred embodiments. Simplifications or omissions in this section as well as in the abstract and the title may be made to avoid obscuring the purpose of this section, the abstract and the title. Such simplifications or omissions are not intended to limit the scope of the present invention The invention pertains to architectures of multi-stage sample rate converters are disclosed. According to one aspect of the present invention, a received signal with a higher sampling rate is decimated to a lower sampling rate. To prevent aliasing in the resultant signal, an anti-aliasing filter is introduced. The passband of the anti-aliasing filter is so adjusted according to the conversation rate of a sample rate converter. To keep the implementation relatively simple, the coefficients of the filter are kept constant. Therefore, the conversation rate of a sample rate converter is constrained in a limited range, thus requiring only a constant anti-aliasing filter. A series of halfband filters are then used to convert the signal to a desired sampling rate.

The present invention may be implemented as an integrated circuit, an apparatus or a part of a system. According to one embodiment, the present invention is an integrated circuit comprising: an anti-alias filter to receive an input signal with a first sampling rate, the anti-alias filter designed to have a cut-off frequency; a sample rate converter, coupled to the anti-alias filter, designed to have a converting ratio that directly determines the cut-off frequency of the anti-alias filter; and one or more down-sampling converters coupled in series to the sample rate converter. As a result, an output with a second sampling rate is produced, wherein the first and second sample rates are generally different.

One of the objects, advantages and benefits of the present invention is to provide an architecture that can efficiently convert an input signal with a first sampling rate to an output signal with a second sample rate. Such an architecture may be advantageously used in various wireless communication systems including WiMAX The foregoing and other objects, features and advantages of the invention will become more apparent from the following detailed description of a preferred embodiment, which proceeds with reference to the accompanying drawings.

BRIEF DESCRIPTION OF THE DRAWINGS

The present invention will be readily understood by the following detailed description in conjunction with the accompanying drawings, wherein like reference numerals designate like structural elements, and in which:

FIG. 1C shows a table of coefficients derived to be used to calculate the distance between two samples in the input and output signals (sequences);

DETAILED DESCRIPTION OF THE INVENTION

The detailed description of the invention is presented largely in terms of procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the sample embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1A:
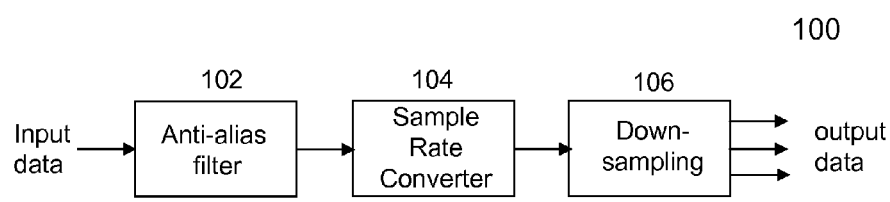
FIG. 1A shows an exemplary architecture of a multi-stage sample rate converter according to one embodiment of the present invention.

Referring now to the drawings, in which like numerals refer to like parts throughout the several views. FIG. 1A shows an exemplary architecture 100 of a multi-stage sample rate converter according to one embodiment of the present invention. The architecture 100 includes an anti-alias filter 102, a sample rate converter 104 and a set of down-sampling converters 106. The anti-alias filter 102 is essentially a low-pass filter with a cut-off frequency that is determined with respect to the sample rate converter 104. According to one embodiment, the sample rate converter 104 is implemented with reference to Lars Erup, "Interpolation in digital modem—part II, implementation and performance", IEEE Transactions on Communications, Vol. 41, No.: 16, June 1993, pp. 998-1008, which is hereby incorporated by reference.

One of the parameters the sample rate converter 104 has is a converting ratio between the sampling rates of the input and output signals. In general, the higher the ratio is, the lower the cut-off frequency of the anti-alias filter 102 has. From the hardware implementation perspective, the ratio is typically kept low (which may not be an integer) so that both the performance and easy hardware implementation of the anti-alias filter 102 as well as the sample rate converter 104 can be readily guaranteed. In one embodiment of down-sampling an input signal, provided that the sample rates for the input and output signals are Fin and Fout, respectively. Then the overall converting ratio R is equal to Fout/Fin. Whenever R is greater than 2, a half-band filter can be used. Accordingly, the converting ratio of the sample rate converter is generally greater than 1 but less than 2.

Figure 1B:
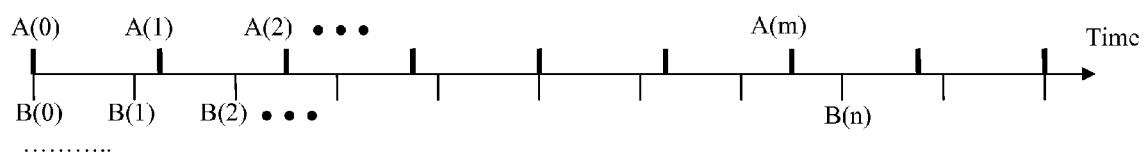
FIG. 1B shows the working principle of a sample rate converter that may be used in the architecture of the multi-stage sample rate converter in FIG. 1A.

FIG. 1B shows the working principle of the sample rate converter 104. It is assumed there is an input sequence {A} with a sampling rate 48 MHz that needs to be converted to a sequence {B} with sampling rate of 60 MHz. In time domain, the positions of {A} and {B} are shown in FIG. 1B. In other words, the value of each point of {B} needs to be calculated according to the corresponding adjacent points of {A}.

For each point B(n), the nearest point of {A} on its left, named A(m) is located. Then a five-order Lagrange polynomial interpolation is performed in accordance with the following equation:

$$B(n) = \sum_{i=-2}^{3} C_i A(m+i)$$

Figure 2:
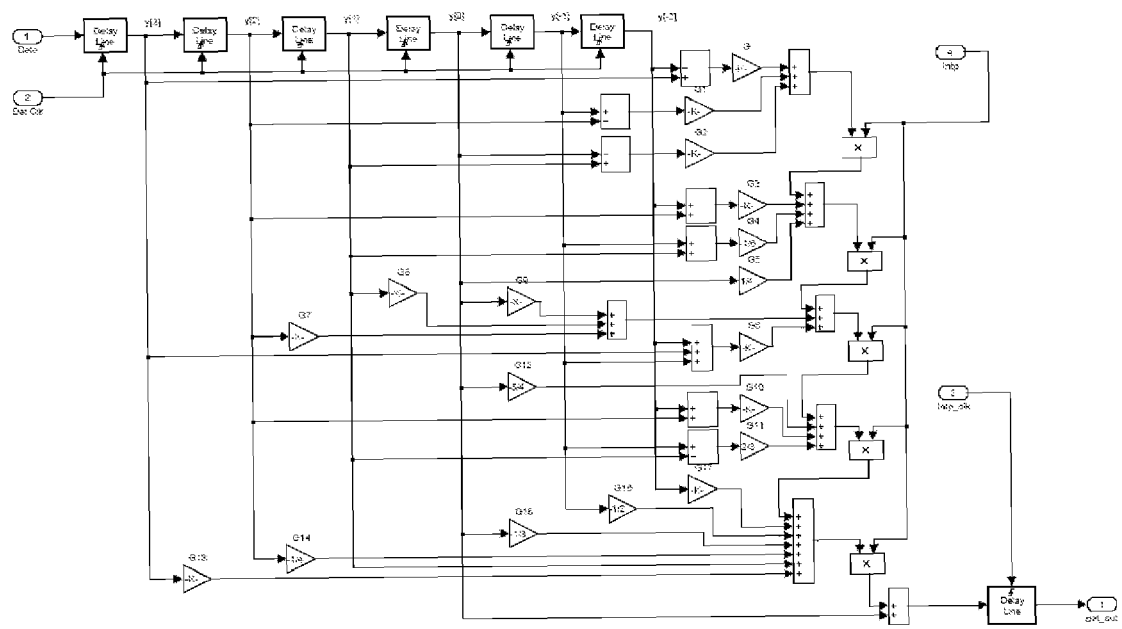
FIG. 2 shows that a sample rate converter with Lagrange polynomial interpolator is implemented with a Farrow structure as in FIG. 2, where the number of unit delay elements is minimized.

It is assumed that the distance between B(n) and A(m) is μ, the coefficients $C_i$ are derived and listed in Table 1 shown in FIG. 1C. The sample rate converter 104 with Lagrange polynomial interpolator is implemented with Farrow structure as in FIG. 2, where the number of unit delay elements is minimized.

Figure 3:
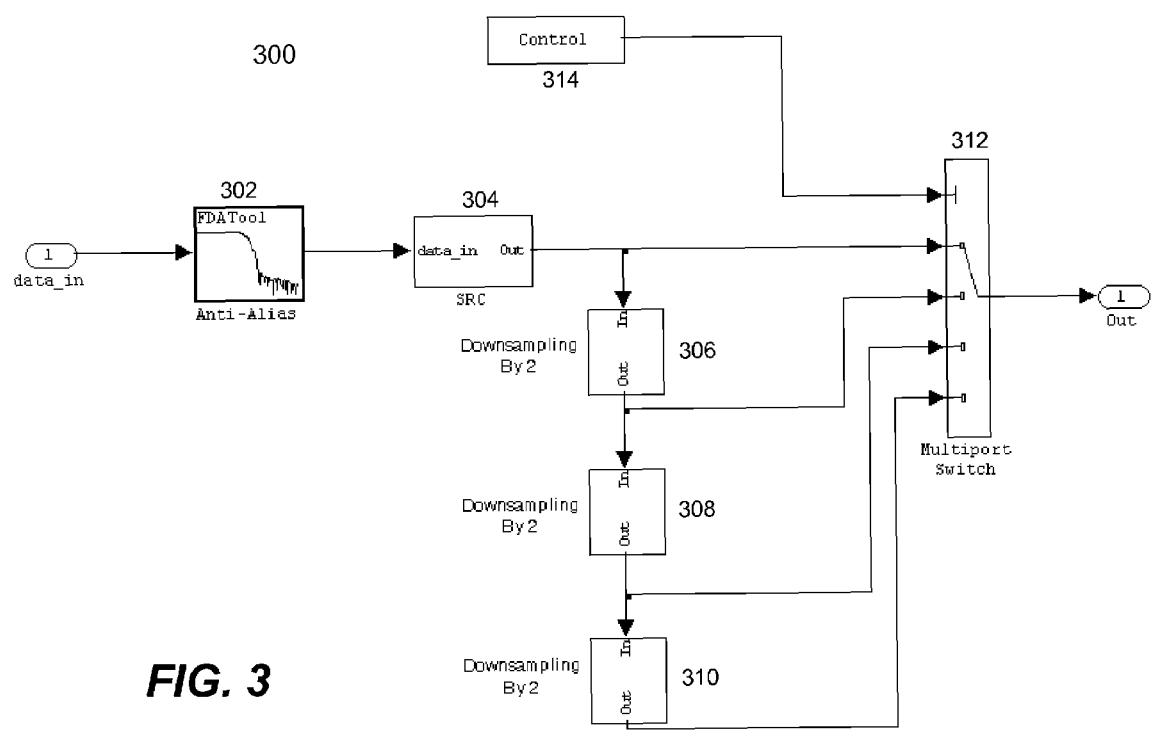
FIG. 3 shows an implementation of a multi-stage sample rate converter that includes an anti-aliasing filter, a sample rate converter and three down-sampling converters

It can be understood that the multi-stage sample rate converter 100 may be used for converting a sampling rate downwards as well as a sampling rate upwards. FIG. 3 shows an implementation of a multi-stage sample rate converter 300 that includes an anti-aliasing filter 302, a sample rate converter 304 and three down-sampling converters 306, 308 and 310. The outputs from the sample rate converter 304 and the three down-sampling converters 306, 308 and 310 are coupled to a multi-port switch 312 (e.g., a multiplexer) controlled by a control signal from a controller 314. As described above, the cut-off frequency of the anti-aliasing filter 302 is directly related to the converting ratio of the sample rate converter 304.

According to one embodiment, the passband of the anti-aliasing filter 302 is adjusted according to the bandwidth of the input signal. The narrower the bandwidth of the input signal is, the higher the order of anti-aliasing filter is. To avoid the complexity of the anti-aliasing filter 302, the converting ratio of the sample rate converter 304 is limited in range, which thus requires only a constant anti-aliasing filter. The further down-sampling of the sampling rate of the input sequence is performed by a set of down-sampling converters, such as the three down-sampling converters 306, 308 and 310. More down-sampling converters may be used if necessary. In one embodiment, each of the down-sampling converters is a half-band filter.

Figure 4A:
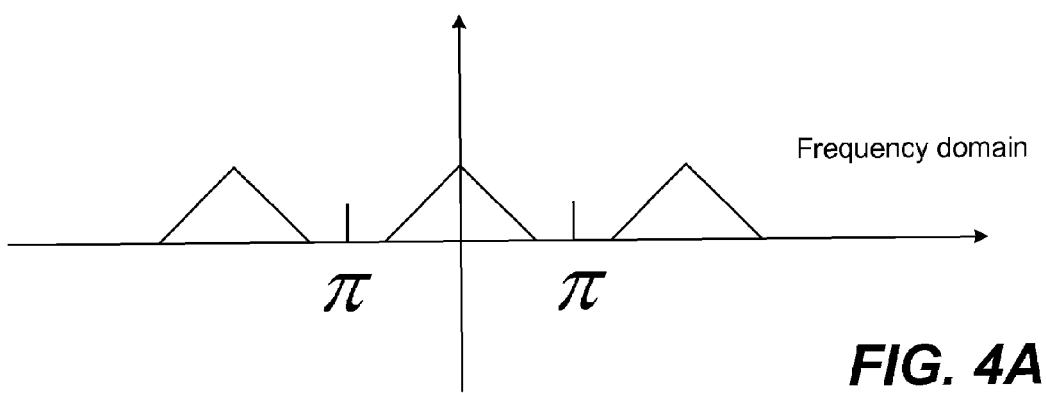
FIG. 4A shows a partial spectrum of an exemplary input signal, which further shows a period of $2\pi$ in the frequency domain.
Figure 4B:
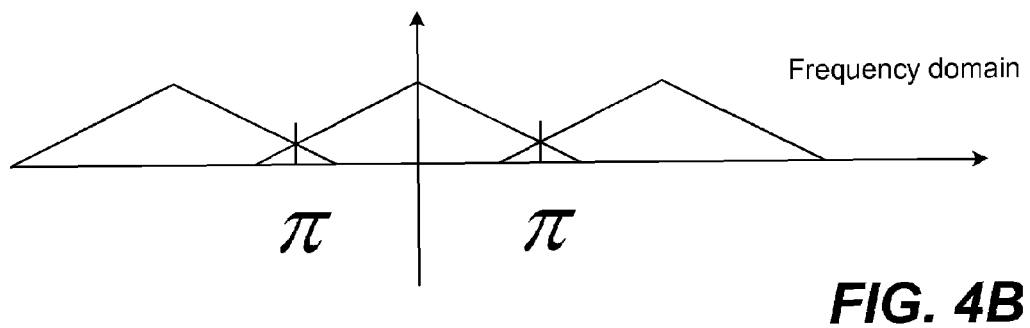
FIG. 4B shows a situation of signal aliasing which is caused by an input signal being down-sampled by R that expands R times in the frequency domain, resulting in overlapping with its images.

FIG. 4A shows a partial spectrum of an exemplary input signal, which further shows a period of 2π in the frequency domain. FIG. 4B shows a situation of signal aliasing which is caused by the input signal being down-sampled by R that expands R times in the frequency domain, resulting in overlapping with its images. To avoid such overlapping, the anti-aliasing filter 302 is introduced. If the down-sample rate (converting ratio) is R, in one embodiment, the pass-band of the anti-aliasing filter 302 is designed to be around π/R. With this limitation, the signal would not expand to π after the down-sampling, thus avoiding the overlapping (i.e., aliasing).

In operation, an input data sequence is coupled to the anti-aliasing filter 302 that filters out frequencies higher than the cut-off frequency. The filtered signal is then coupled to the sample rate converter 304 that converts the signal to a signal with a sampling rate per the fixed converting ratio of the sample rate converter 304. This converted signal is then going through a number of down-sampling converters with a fixed converting ratio (e.g., 2). Each of the down-sampling converters (three of them are shown in the figure) produces a converted signal with a sampling rate lower than a previous one. These outputs, from the sample rate converter 304 as well as the three down-sampling converters 306, 308 and 310, are coupled to the multi-port switch 312. The output sequence can be produced from any one of the outputs via the multi-port switch 312 depending on application.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. While the embodiments discussed herein may appear to include some limitations as to the presentation of the information units, in terms of the format and arrangement, the invention has applicability well beyond such embodiment, which can be appreciated by those skilled in the art. Accordingly, the scope of the present invention is defined by the appended claims rather than the foregoing description of embodiments.

We claim:

1. An integrated circuit providing an output signal, the integrated circuit comprising:
   an anti-alias filter to receive an input signal with a first sampling rate;
   a sample rate converter, coupled to the anti-alias filter, designed to have a converting ratio being greater than 1 but less than 2, wherein, whenever a ratio of sample rates of the input signal and the output signal is greater than 2, a half-band filter is used to reduce the ratio so that coefficients of the anti-alias filter are constant; and
   one or more down-sampling converters coupled in series to the sample rate converter to further reduce the ratio of sample rates.

2. The integrated circuit as recited in claim 1, further comprising a multi-port switch with a number of input ports, each receiving a converted signal from the sample rate converter and one of the one or more down-sampling converters.

3. The integrated circuit as recited in claim 2, wherein the multi-port switch is controlled by a signal to determine which one of the input ports of the multi-port switch to be connected to an output of the multi-port switch.

4. The integrated circuit as recited in claim 1, wherein the input signal has a higher sampling rate and is decimated to an output signal with a lower sampling rate via the integrated circuit.

5. The integrated circuit as recited in claim 4, wherein the anti-aliasing filter is introduced to prevent aliasing in the output signal.

6. The integrated circuit as recited in claim 5, wherein the integrated circuit is in a receiver to receive wireless signals compliant with a wireless specification allowing signals with multiple sample rates.

7. The integrated circuit as recited in claim 6, wherein the wireless specification is WiMAX.

8. The integrated circuit as recited in claim 1, wherein coefficients of the anti-alias are kept constant.

9. The integrated circuit as recited in claim 8, wherein the converting ratio of the sample rate converter is greater than 1 but less than 2.

10. The integrated circuit as recited in claim 9, wherein each of the one or more down-sampling converters is a half-band filter.

11. An integrated circuit providing an output signal, the integrated circuit comprising:

an anti-alias filter with a constant cut-off frequency to receive an input signal;

a sample rate converter, coupled to the anti-alias filter, designed to have a converting ratio being greater than 1 but less than 2;

a number of down-sampling filters coupled in series to the sample rate converter, the exact number of the down-sampling filters in use being determined by a ratio of sample rates of the input signal and the output signal to keep the converting ratio of the sample rate converter greater than 1 but less than 2.

12. The integrated circuit as recited in claim 11, wherein R=the ratio of sample rates of the input signal and the output signal, and R is reduced by 2 for each of the down-sampling filters used till R is greater than 1 but less than 2.

13. The integrated circuit as recited in claim 12, wherein the sample rate converter is implemented based on Lagrange polynomial interpolation and in Farrow structure.

14. The integrated circuit as recited in claim 11, wherein the cut-off frequency of the anti-alias filter is directly determined by the converting ratio of the sample rate converter.

15. The integrated circuit as recited in claim 14, wherein the cut-off frequency of the anti-alias filter is nearly constant because the converting ratio of the sample rate converter is in a limited range.

* * * * *